United States Patent [19]
Irie

[11] Patent Number: 4,718,967
[45] Date of Patent: Jan. 12, 1988

[54] CONTROL APPARATUS FOR REDUCING ADHESIVE FORCE OF ADHESIVE AGENT ADHERING BETWEEN SEMICONDUCTOR WAFER AND SUBSTRATE

[75] Inventor: Eiichi Irie, Washimiya, Japan

[73] Assignee: Efuesukei Kabushiki Kaisha, Tokyo, Japan

[21] Appl. No.: 940,328

[22] Filed: Dec. 11, 1986

[30] Foreign Application Priority Data

Dec. 12, 1985 [JP] Japan .................. 60-190304[U]
Nov. 4, 1986 [JP] Japan .................. 61-168197[U]

[51] Int. Cl.$^4$ ............................................. B32B 31/26
[52] U.S. Cl. .......................... 156/379.6; 156/272.2; 156/344; 156/382; 156/380.9; 250/492.1
[58] Field of Search ............... 156/344, 584, 378, 379, 156/272.2, 379.8, 380.9, 381, 382; 250/492.1, 492.2; 29/583

[56] References Cited

U.S. PATENT DOCUMENTS 4,436,985  3/1984  Weber ........................... 250/492.1
4,656,358  4/1987  Divens et al. ................. 250/492.1
4,664,739  5/1987  Furichio ........................ 156/344

FOREIGN PATENT DOCUMENTS 58-50164  11/1983  Japan .
59-42892  3/1984  Japan .
60-172345  11/1985  Japan .

Primary Examiner—David Simmons
Attorney, Agent, or Firm—Armstrong, Nikaido, Marmelstein & Kubovcik

[57] ABSTRACT

The apparatus includes a treating container having a light transmission window and a closure member for opening and closing the container, a light source positioned opposite the light transmission window, and equipment for deoxygenating at least a substantial portion of the oxygen from the interior of the container. The container is charged with a semiconductor wafer adhered to a substantially light transparent substrate by a photo-setting adhesive agent. The agent is cured or hardened by irradiation by the light source thereby decreasing its adhesive force. A first cassette casing, a charging conveyor for removing untreated workpieces from the first cassette casing, a charging conveyor for removing untreated workpieces from the charging conveyor into the container can be provided at one side of the container. A discharging arm for removing the treated workpiece from the container, second cassette casing, and a discharging conveyor for transferring treated workpieces from the discharging arm to the second cassette casing can be provided on the other side of the container.

5 Claims, 13 Drawing Figures

CONTROL APPARATUS FOR REDUCING ADHESIVE FORCE OF ADHESIVE AGENT ADHERING BETWEEN SEMICONDUCTOR WAFER AND SUBSTRATE

BACKGROUND OF THE INVENTION

This invention relates to an apparatus for controlling and reducing the adhesive force of an adhesive agent for the purpose of simplifying and easing the removal of a semiconductor wafer such as a silicon wafer or the like adhered to a substrate such as a synthetic resin film or the like from the substrate.

A process has been known wherein, after a semiconductor wafer is applied with a circuit forming treatment, such as by etching or the like so that IC circuits are formed thereon, the wafer is adhered by an adhesive agent to a substrate such as a synthetic resin film or the like to form a workpiece. The wafer is then cut into IC dice. Thereafter each bare die is taken off of the substrate and mounted in a package to form an IC chip. In this case, it is desireable that each bare die taken off of the substrate be free of any contamination, such as any part of the adhesive agent transferred to a rear surface of the die. As disclosed in Japanese Patent Application Publication Sho No. 58-50164, a photo-setting type adhesive agent has been proposed to be used. The photo-setting adhesive agent is hardened or cured by irradiation. That is, after cutting the wafer into dice, the photo-setting adhesive agent is irradiated by shining a light thereonto. This results in a decrease in the adhesive strength of the agent. In this manner, transfer of the adhesive agent to the rear surface of each die can be prevented when the die is taken off of the substrate.

Additionally, a process has been known wherein a cassette casing is prepared containing plurality of the workpieces. Each workpiece is taken out, one by one, from the casing and subjected to the foregoing photo-setting treatment of the adhesive agent thereof. Thereafter the individual treated workpiece is conveyed into an empty cassette casing for being conveyed to the next treating step.

In this case, the amount of time of irradiation of light thereon required for sufficiently decreasing an adhesive force or strength of the photo-setting adhesive agent of the workpiece is above 10 seconds, even in a case where the adhesive agent has a quick hardening property. Such a period of time is too long as a photo-setting treatment time for an IC chip manufacturing process and is not desirable.

OBJECTS AND SUMMARY OF THE INVENTION

A purpose of this invention is to provide an apparatus suitable for shortening the required time for irradiating a light onto the workpeice.

In addition, it is desirable to improve the efficiency of such a photo-setting treatment of plural workpieces especially when those workpieces contained in the cassette casing are automatically taken out one by one, and after being subjected to the foregoing photo-setting treatment, are automatically placed into the other cassette casing one by one.

Another purpose of this invention is to provide an apparatus which can meet this desire and can perform the foregoing photo-setting treatment automatically.

According to a first aspect of this invention, for achieving the foregoing first object, there is provided an apparatus for treating a workpiece formed of a semiconductor wafer adhered by a photo-setting adhesive agent to a substantially light transparent substrate such as a substantially light transparent synthetic resin, sheet, film or the like. The invention is characterized in that the apparatus comprises a treating container to be charged with the workpiece and having a light transmission window and a closure member for opening and closing the container, a light source such as a mercury vapor lamp or the like located opposite to the light transmission window, and a deoxygenating means for removing at least a substantial portion of the oxygen in the internal atmospheric of the container connected to the container.

According to a second aspect of this invention, for achieving the foregoing second object, the invention is characterized in that the apparatus further comprises a cassette casing which is movable upward and downward and contains a plurality of the foregoing workpieces, a charging conveyer for taking out each workpiece from the cassette casing, and a charging arm for charging each workpiece taken out as above into the container by a sucker means thereof, provided on one side of the treating container; and a discharging arm for discharging the workpiece from the container by a sucker means thereof, and a discharging conveyer for conveying the workpiece taken out as above, into an empty cassette casing which is movable upward and downward, provided on the other side of the treating container.

Next, the operation of this apparatus is explained as follows:

Once the step for forming a large number of IC circuits on the surface of the semiconductor of the workpiece is completed, the wafer is cut into divisional dice for respective IC circuits. Each die is taken off of the substrate and is mounted in a package to form an IC chip. In this case, the wafer is adhered to the substrate such as a substantially light transparent synthetic resin sheet, film or the like through the adhesive agent. Prior to taking the dice off of the substrate, the workpiece is irradiated by a light whereby the photo-setting adhesive agent is at least partially cured or hardened, so that the adhesive force thereof is decreased.

This photo-setting treatment is carried out by charging the workpiece into the opened container and closing the container by the closure member. The internal atmospheric air in the container is exchanged by nitrogen gas or the like introduced into the container so that the internal atmosphere is brought into a condition of substantially not containing oxygen. Under the resultant deoxygenated condition, the adhesive agent is irradiated by a light from the light source through the light transmission window of the container so that its adhesive force may be sufficiently decreased. After external atmospheric air is introduced into the container, the workpiece is taken out after the closure member thereof is opened. According to this treatment, the adhesive force can be sufficiently weakened by irradiating light onto the adhesive agent only for about 1 second, such that substantially no adhesive agent is transferred to the rear surface of each die subsequently picked up from the substrate.

Additionally, according to further aspects of the apparatus for the foregoing procedure, plural workpieces so placed into the elevatable cassette casing as to be oriented in a single predetermined orientation, are taken out therefrom, one by one, through a charging conveyer to one lateral side of the container. The workpieces thus taken out are charged, one by one, into the container by a sucker means of a charging arm. Thereafter the workpiece adhesive agent while in the closed container is treated with the photo-setting treatment as described above. After the completion of the photo-setting treatment, the workpiece is discharged from the container by a sucker means of a discharging arm to a discharging conveyer and is further conveyed into the elevatable empty cassette casing by the discharging conveyer.

BRIEF DESCRIPTION OF THE DRAWINGS

The above and other objects and the attendant advantages of the present invention will become readily apparent by reference to the following detailed description when considered in conjuction with the accompanying drawings wherein.

DETAILED DESCRIPTION OF PREFERRED EMBODIMENTS

Figure 1:
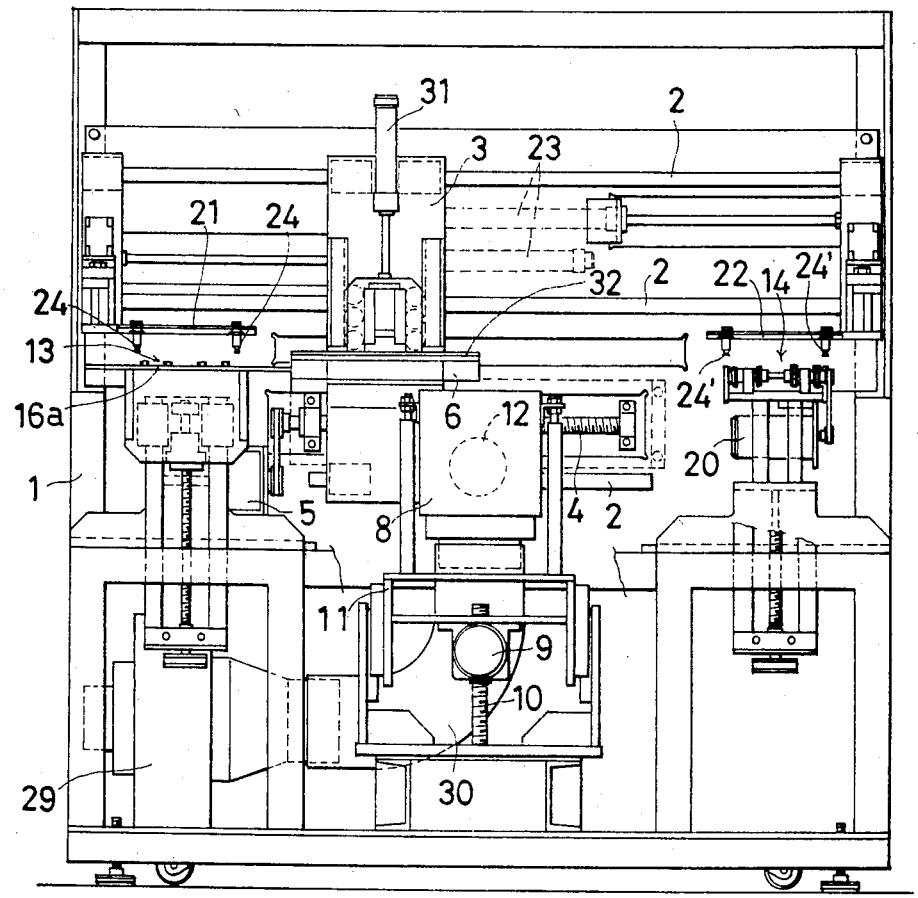
FIG. 1 is a front view of a first embodiment of this invention.

Embodying examples of this invention will now be explained with reference to the accompanying drawings:

Referring to FIGS. 1-4, a machine frame 1 of a control apparatus for decreasing an adhesive force supports a pair of upper and lower guide rods 2, 2 extending horizontally leftward and rightward at a rear section of the machine frame 1. movable plate 3 is movable rightward and leftward of the frame 1 while being guided by the guide rods 2, 2. A feeding screw 4 is provided for moving the movable plate 3. An electric motor 5 drives the feeding screw 4.

The movable plate 3 is provided with a treating container 6 horizontally extending forward therefrom so as to be integral therewith. The machine frame 1 extends forwardly beneath the container 6. A light source 12 is encased by a casing 8 and is attached to a base frame 11 which is movable upwards and downwards along a screw rod 10 by driving an electric motor 9.

A charging conveyer 13 is provided on one side of the light source 12. A discharging conveyer 14 is provided on the other side of the light source 12. The conveyers 13, 14 are arranged each having one end portion thereof positioned adjacent to U-shaped end portions of respective working tables 16a, 16b which are movable upward and downward by pulse motors 15, 15.

Figure 5:
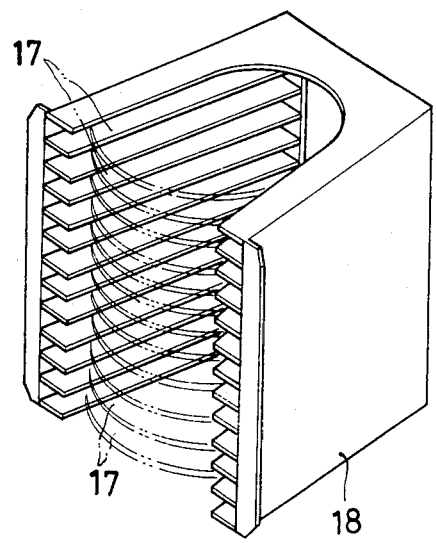
FIG. 5 is a perspective view of a cassette casing.

A cassette casing 18 having a large number of shelves and containing plural workpieces 17 resting on the repsective shelves, as shown in FIG. 5, is mounted on the work table 16a and on the charging conveyer 13 so that when the work table 16a is lowered together with the cassette casing 18 and the lowermost workpiece 17 is placed on the charging conveyer 13, a driving motor 19 is controlled and operated to drive the conveyer 13. In this manner, the workpiece 17 is drawn out from the cassette casing 18. The cassette casing 18 is lowered by one step at a proper time for the next drawing out operation.

An empty cassette casing 18, initially not containing any workpieces 17, is mounted on the work table 16b located adjacent to the discharging conveyer 14 so that when the treated workpiece 17 is placed on the discharging conveyer 14, a driving motor 20 as clearly shown in FIG. 1 is controlled and operated to drive the conveyer 14. In this manner, a treated workpiece 17 is conveyed into the empty cassette casing 18 and placed on the uppermost shelf thereof. At the time of completion of this encasing operation, the work table 16b is elevated, by one step, together with the casing 18 by operation of the pulse motor 15 to be ready for the next encasing operation.

A charging arm 21 and a discharging arm 22 are arranged to linearly reciprocate along on the guide rods 2, 2 of the machine frame 1 by action of air cylinders 23, 23. The charging arm 21 is arranged so that the workpiece 17 conveyed out of the cassette casing 18 by the charging conveyer 13 may be charged into the container 6, by a sucker means carrying sucker pads 24 provided on a lower surface thereof. On the other hand, the discharging arm 22 is arranged to discharge the workpiece 17 from the container 6 onto the discharging conveyer by a sucker means 24' thereof.

These sucker means 24, 24' are connected to proper suction control means (not illustrated) so that the attraction and release of the workpiece may be controlled properly for charging and discharging the workpiece into and out of the container 6.

Figure 6:
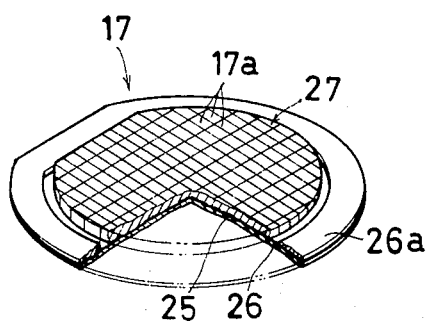
FIG. 6 is a perspective view, partly omitted, of a workpiece.

The details of the workpiece 17 are as shown clearly in FIG. 6. Namely, the workpiece is prepared by adhering a semiconductor wafer 27 comprising a silicon wafer to a circular substrate 26 made of a substantially transparent synthetic resin, sheet, film or the like such as of vinyl chloride, polyethylene terephthalate, polypropylene or the like by using a photo-setting adhesive agent 25. Thereafter, the wafer 27 is diced into plural dice 17a. The adhesive agent 25 can be for instance, one that is composed of an acrylic series adhesive agent of 10–90 weight parts and an urethane acrylate series olygomer of 90–10 weight parts. Such an adhesive agent is hardened, through polymerization, as to be extremely weak in its adhesive force by being irradiated by a light in a broad sense such as an ultraviolet ray from a mercury vapor lamp, an electron beam from an electron tube or the like. A flange panel 26a made of SUS stainless steel is adhered to a circumferential edge portion of the substrate 26 so that the workpiece 17 may be moved by gripping the flange 26a by suction of the sucker pads of the respective sucker means 24, 24' of the charging arm 21 and the discharging arm 22.

In the illustrated example, a mercury vapor lamp of 80 W/cm is used for the light source 12. The lamp is arranged to irradiate the bottom surface of the closed container 6 when the container 6 goes across over a slit 28 made in an upper portion of the casing 8 encasing the light source 12. An electron beam generating means may be used for the light source 12. A cooling fan 29 can be connected by cooling duct 30 to the casing 8 for the light source 12.

Figure 7:
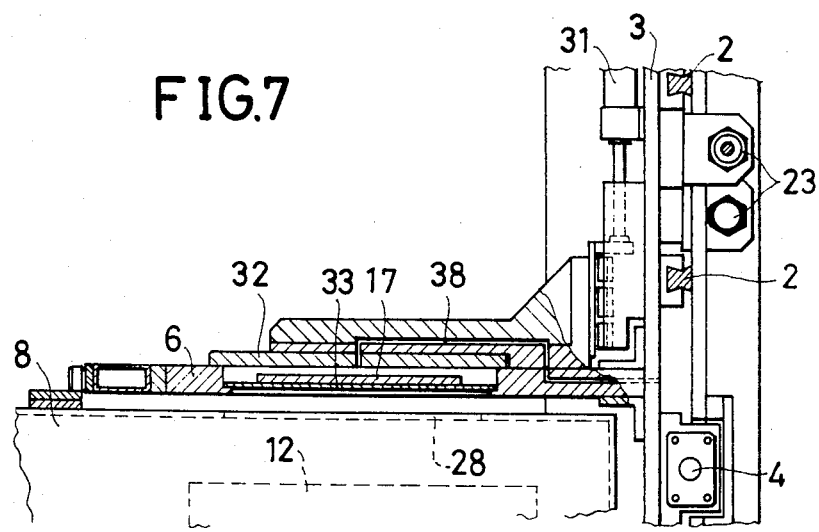
FIG. 7 is an enlarged sectional view of an important portion of the apparatus.
Figure 8:
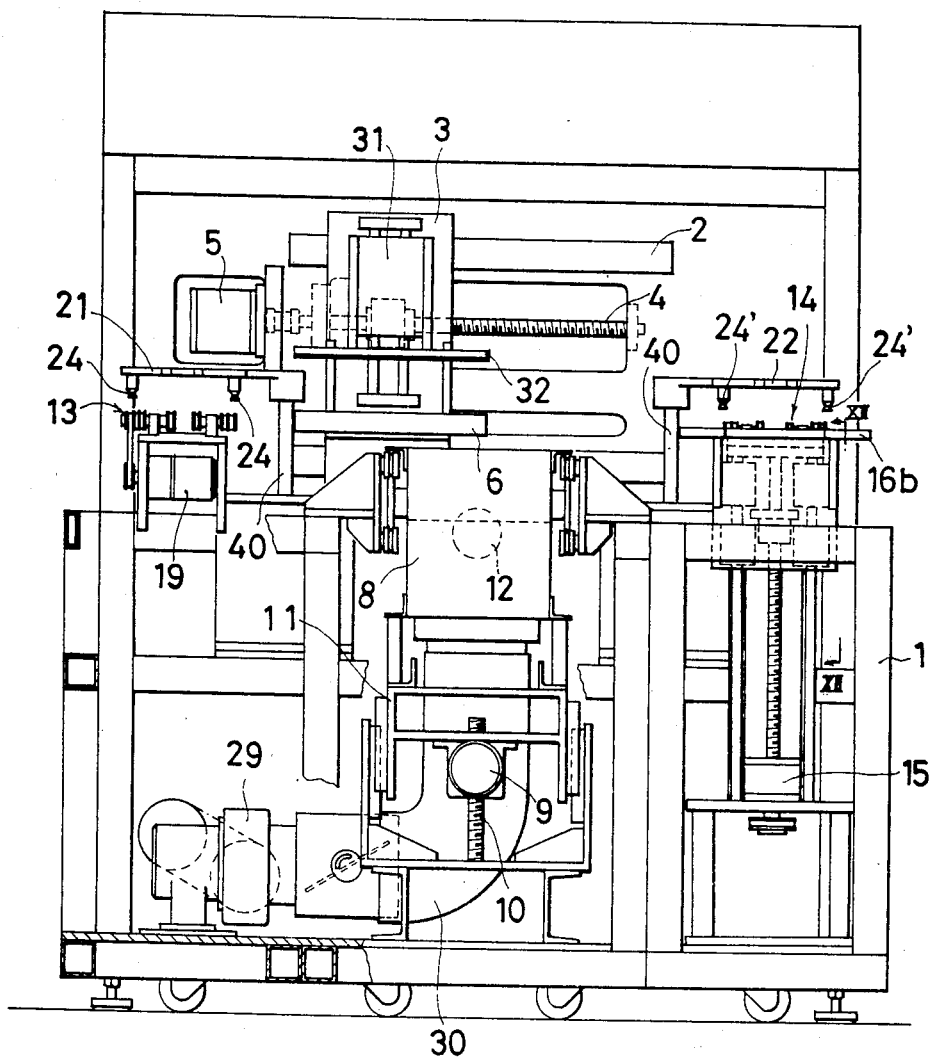
FIG. 8 is a front view of another embodiment of this invention.

As shown clearly in FIG. 7, the treating container 6 is provided, on its upper side, with a closure member 32 which can open and close the container by being moved upward and downward by a cylinder 31 provided on the movable plate 3. The container 6 is provided, on its bottom portion, with a light transmission window 33 which is arranged to face the light source 12. The light transmission window 33 comprises an ultraviolet ray transparent glass pane if the light source 12 is a mercury vapor lamp, and is a window pane made of Beryllium if the light source 12 is an electron beam generating means.

Figure 2:
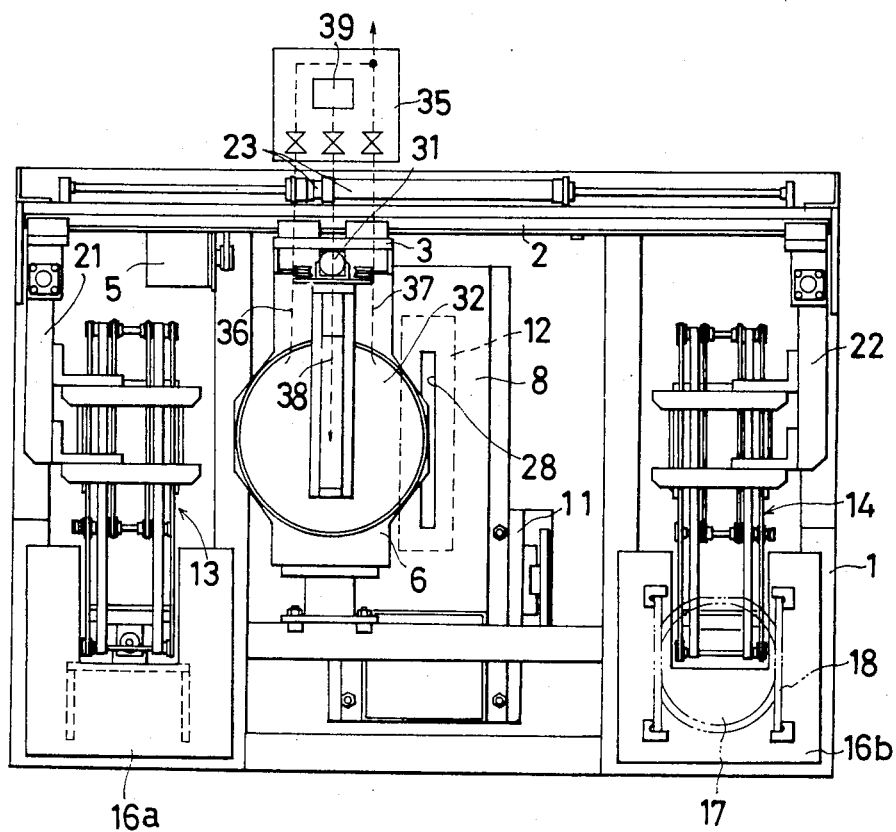
FIG. 2 is a top plan view thereof.
Figure 3:
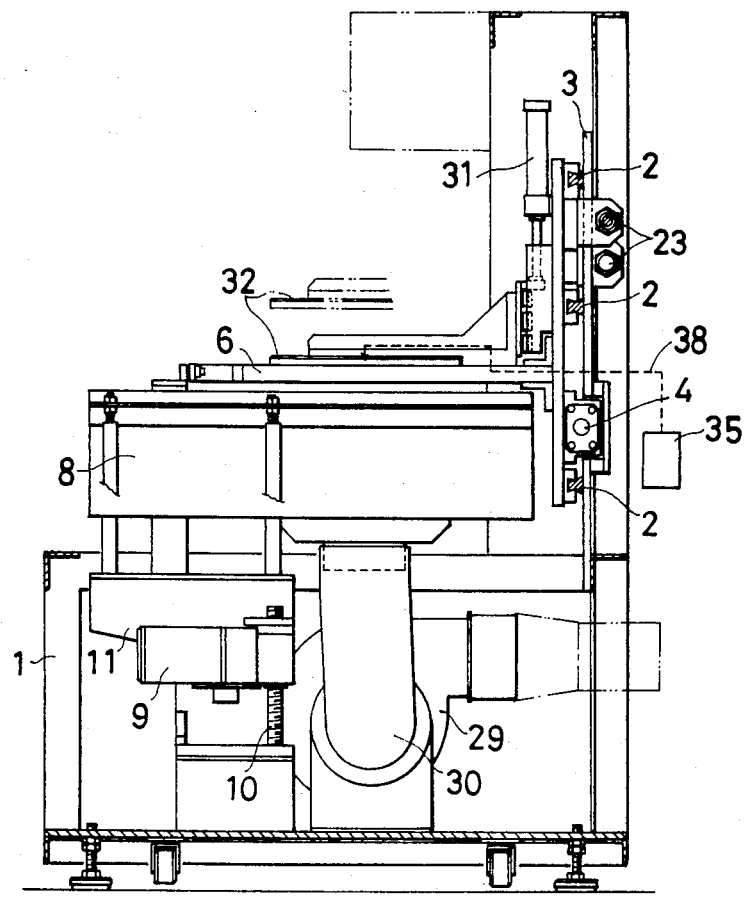
FIG. 3 is a right side view, partly in section, of the same.
Figure 4:
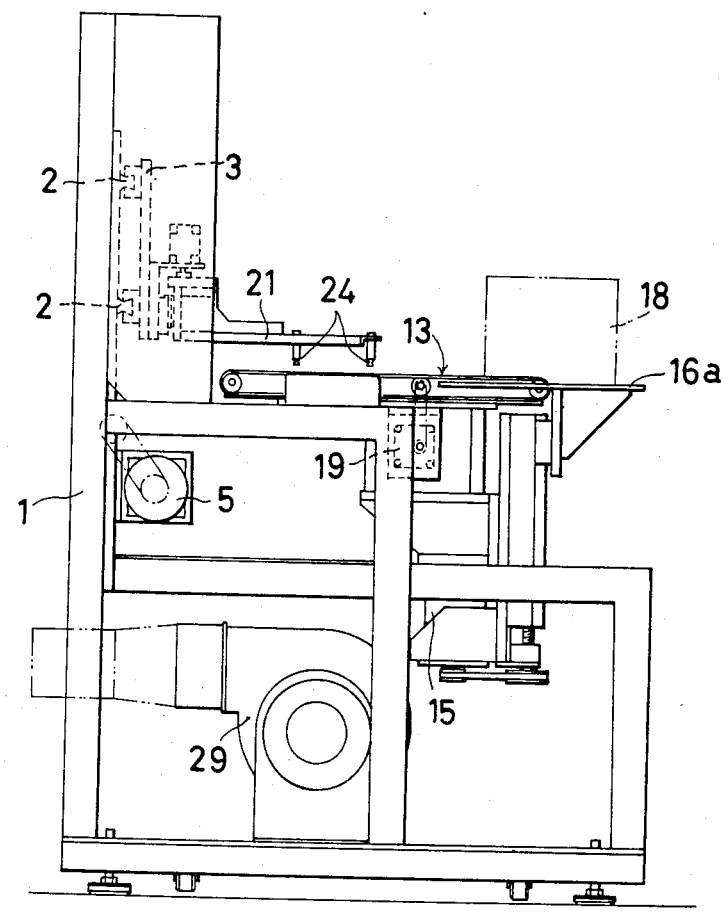
FIG. 4 is a left side view of the same.

A deoxygenating means 35 is composed of passages 36, 37, 38 and a nitrogen gas bomb 39. More in detail, as shown in FIG. 2, the passages 36, 37, 38 connected to a deoxygenating means 35 are made in the closure member 32, so that if the passages 36, 37 are opened to the external atmosphere and the nitrogen gas is introduced into the closed container 6 through the passage 38 from the nitrogen gas bomb 39, the air in the container 6 is replaced with the nitrogen gas and there is established in the container 6 an atmosphere substantially free from oxygen.

A modified deoxygenating means for removing the internal atmospheric air of the container 6 may be considered wherein the internal atmospheric air of the container 6 may be evacuated by a vacuum pump. In this case, the closure member 32 and the light projecting window 33 in relation to the container body have to be constructed to be airtight to prevent any external air from entering therethrough.

However, such a modified construction would result in an increase in manufacturing cost thereof. Accordingly, if such an arrangement as shown in the illustrated example that the internal atmospheric air of the container is expelled by introducing nitrogen gas is adopted, the requirement for airtightness of the container can be more or less eased to result in the comparatively lower manufacturing costs.

Such a modification can be considered wherein the oxygen is removed by introducing any other inert gas rather than nitrogen gas into the container 6. A further modified deoxygenating means can be provided such that, after the internal atmospheric air of the container 6 in once evacuated by an evacuation pump, an inert gas or the like is introduced thereinto, so that there is established an oxygen-free atmosphere in the container.

If, there is established an internal atmospheric condition in the container wherein the content of oxygen of the atmosphere in the container 6 is below about 1%, the adhesive agent 25 can be hardened by a light irradiating thereonto in a moment to lower its adhesive force. As a result, each die 17a formed by cutting of the wafer 27 can be taken off of the substrate 26 by only a slight force, and no adhesive agent 25 remains on the rear surface of the die 17a.

The operation of the apparatus shown in FIGS. 1-4 is as follows:

Firstly, the cassette casing 18 containing plural workpieces 17 resting on the respective shelves with the wafers of the workpieces directed upwards is placed on the work table 16a located adjacent to the charging conveyer 13. An empty cassette casing 18 is placed on the work table 16b located adjacent to the discharging conveyer 14. When the charging conveyer 13 is operated to draw out a desired one of the workpieces 17 from the cassette casing 18, the workpiece 17 drawn out as above is attracted and charged into the opened container 6 by the sucker means 24 of charging arm 21. Thereafter, the container 6 is closed by the closure member 32 and the air contained in the closed container 6 is expelled therefrom by the nitrogen gas introduced thereinto from the deoxygenating means 35, so that an atmosphere substantially free from oxygen is established in the container 6. Under this atmospheric condition, when the closed container 6 is moved across over the light source 12, the light irradiates onto the adhesive agent 25 of the workpiece 17 through the light transmission window 33 and the substantially transparent substrate, so that the adhesive agent 25 is set or hardened and its adhesive force decreases.

After the completion of this operation, the closure member 32 of the container 6 is opened, and the treated workpiece 17 is picked up and moved to the discharging conveyer 14, by the suction operation of the sucker means 24' of the discharging arm 22. The treated workpiece 17 is placed on the discharging conveyer 14 by releasing the suction of the sucker means 24', and the workpiece 17 is conveyed into the empty cassette casing 18 on the work table 16b by the discharging conveyer 14 so as to be placed on the shelf thereof.

More concretely, the operation is carried out, for instance under the condition that the slit 28 of the casing 8 for the light source 12 is about 50 mm in width, the closed container 6 is moved to pass across over the light source 12 at a speed of about 120 mm/sec., the wafer 27 of the workpiece 17 is 5 inches in diameter, the light source 12 is of 80 W/cm, and the quantity of light of 230 mW/cm$^2$ is obtained at the position of the container 6. On this occasion, the workpiece 17 is exposed to the irradiation of light from the light source 12 only for about 1.4 seconds, but each die 17a can be taken off of the substrate 26 using only an extremely weak force. No adhesive agent 25 remains on the rear surface thereof, so that the producing of any unfavorable IC die caused by adhering of the adhesive agent 25 thereto can be eliminated.

In a case where there is a lack of space for installing the driving means for driving the charging and discharging arms 21, 22, a construction as shown in FIGS. 8-12, can be considered. Namely, the arms 21, 22 can be attached to supporting shafts 40, 40 on the machine frame 1 on both lateral sides of the container 6 so that the arms 21, 22 may swing by the turning the shafts 40, 40 by respective rotary actuators 41, 41. In this case, when the workpiece 17 is charged into the container 6 by swinging of the charging arm 21 and when the same is discharged therefrom by swining of the discharging arm 22, the workpiece 17 is turned through angles corresponding to the swing angles of those arms 21, 22 as shown in FIG. 13. When, for instance, each arm 21, 22 turns 90 degrees in its turning angle, the position of the workpiece 17 is turned to its symmetrical or opposite orientation by an angle of 180 degrees. If the workpiece 17 should be conveyed into the receiving cassette casing 18 as it is at its opposite orientation, the relative positional relationship between the workpiece 17 and the cassette casings 18 would be changed before and after the photosetting treatment step. Consequently, quality control of the dice 17a becomes difficult. Namely, if a die which is inferior in quality should be produced, it becomes difficult to pursue and find the cause of the production of the die of inferior quality by retracing each manufacturing step.

For eliminating the foregoing inconvenience caused by such a turning of the workpiece 17 as above, a table 42 for receiving the workpiece 17 is provided, at a final position of the discharging arm 22 that is just above the discharging conveyer 14 as a result of discharging the workpiece 17 from the container 6. The table 42 turns the workpiece through a predetermined angle and transfers the workpiece to the discharging conveyer 14, so that the discharged workpiece 17 may be turned to its initial angular orientation, and be conveyed into the empty cassette casing 18 oriented as it is in its initial position.

Namely, the workpiece 17 turned by the two arms 21, 22 is received on the table 42 and is further turned by 180 degrees to its initial orientation by the table 42. Thereafter, the workpiece is conveyed into the receiving cassette casing 18 by the discharging conveyer 14, so that the relative positional relationship between the workpiece 17 and the cassette casings 18 before and after the setting treatment of the adhesive agent 25 of the workpiece 17, can remain unchanged.

Figure 9:
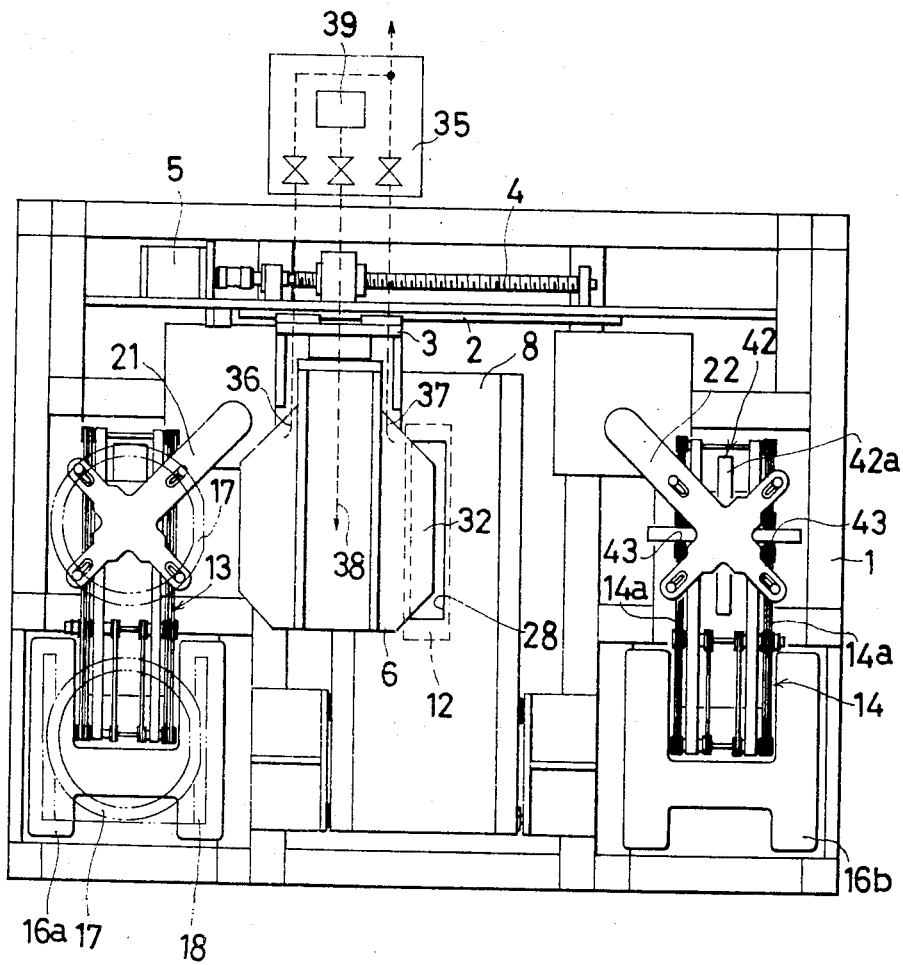
FIG. 9 is a top plan view thereof.
Figure 10:
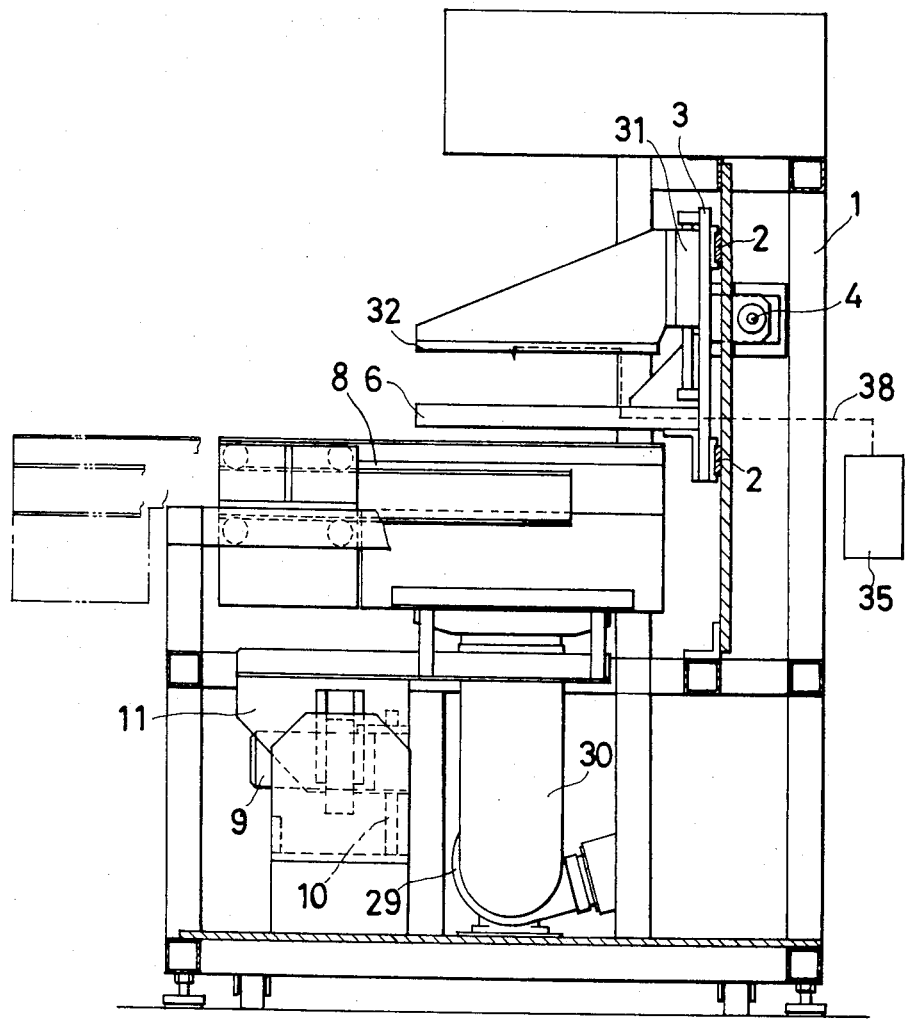
FIG. 10 is a right side view, partly in section, of the same.
Figure 11:
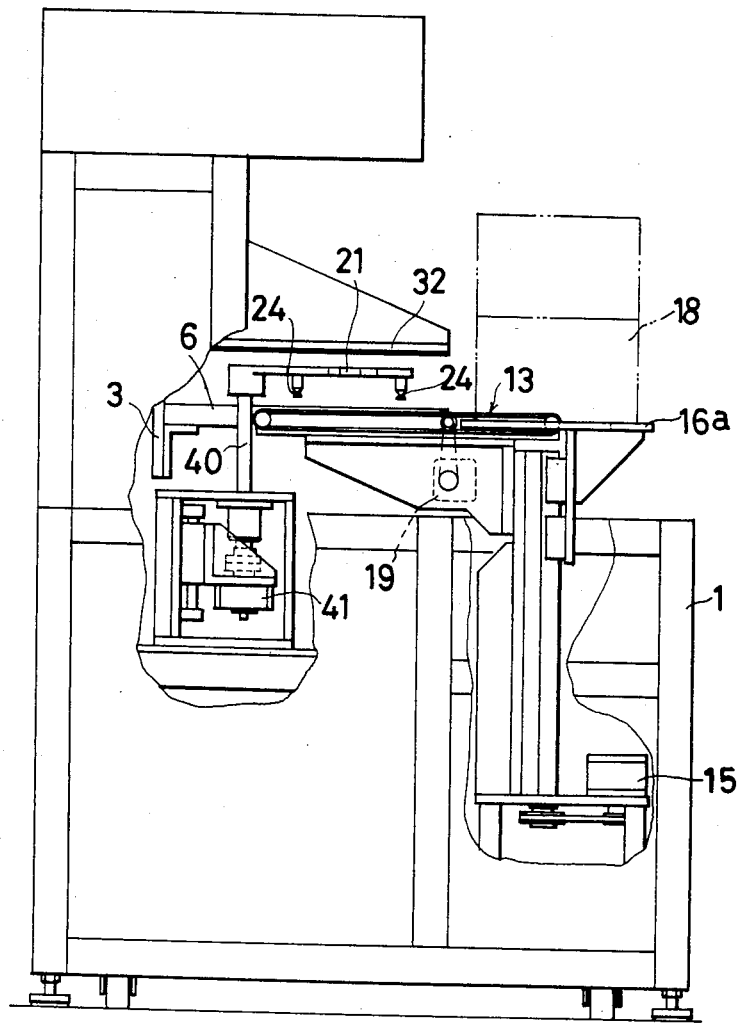
FIG. 11 is a left side view of the same.
Figure 12:
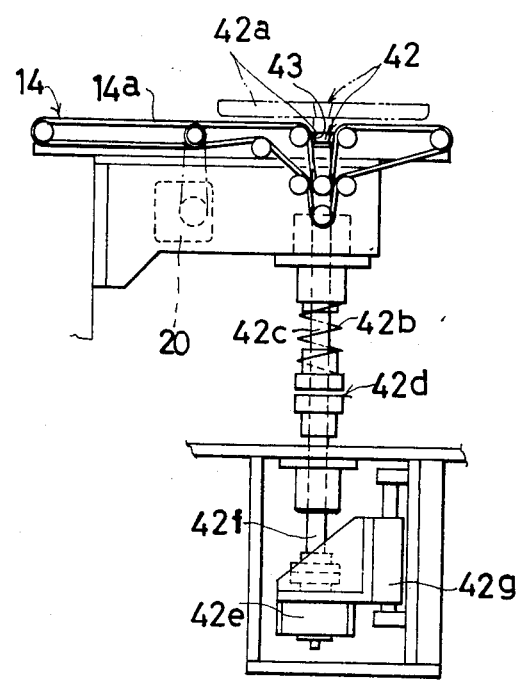
FIG. 12 is a side view viewed from the line XII—XII in FIG. 8.
Figure 13:
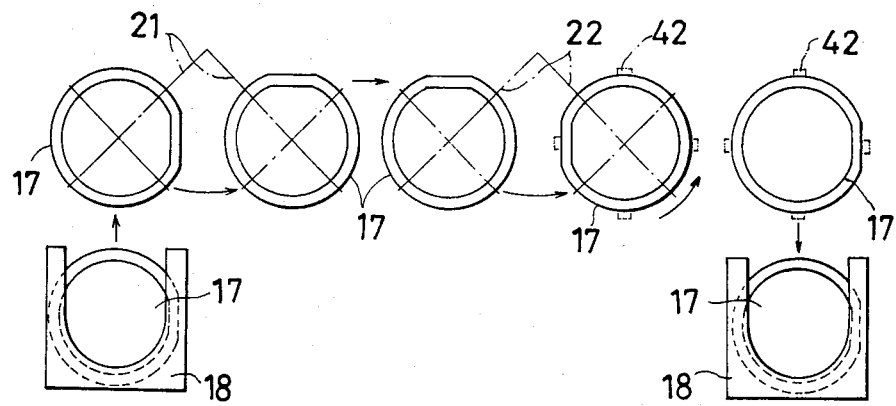
FIG. 13 is a top plan view for explaining a conveying mode of a workpiece.

In the illustrated example, as shown in FIGS. 9 and 12, left and right belts 14a, 14a constituting the discharging conveyer 14 are curved downwards, at their middle portions, to form respective spaces 43, 43, and a cross-shaped supporting base 42a constituting the table 42 is provided to be movable free to go into the spaces 43, 43 and out therefrom.

The table 42 is constructed such that the supporting base 42a is attached to an upper end of an elevating rotatable shaft 42c urged by a spring 42b, so that if an output shaft 42f of a rotary actuator 42e is connected thereto through a clutch 42d by an upwards movement of an air cylinder 42g, the rotatable shaft 42c may be given an upward movement against the action of the spring 42b and additionally a turning movement made by turning of the rotary actuator 42e may be given to the supporting base 42a. After the workpiece 17 is turned by 180 degrees by the two arms 21, 22, the table 42 is given a turning of 180 degrees by the rotary acutator 42e.

Thus, according to a first aspect of this invention, a workpiece comprising a semiconductor wafer adhered by photo-setting adhesive agent to a substrate is charged into a container having a light transmission window and a closure member and the air in the closed chamber is removed by deoxygenating means. Under this oxygen free condition, the photo-setting adhesive agent is irradiated by a light in the closed container, so that the adhesive force of the adhesive agent is weakened in a moment. The amount of time for manufacturing a semiconductor chip can be shortened and the productivity thereof can be improved. According to a second aspect of this invention, a cassette casing containing plural workpieces, a charging conveyer and a charging arm are provided on one side of the container, and a discharging arm for taking out the workpiece from the container, a discharging conveyer and an empty cassette casing are provided on the other side thereof, so that the treatment for weakening the adhesive force of the adhesive agent of the workpiece can be carried out automatically at a high efficiency.

It is readily apparent that the above-described control apparatus for adhesive force of adhesive agent meets all of the objects mentioned above and also has the advantage of wide commercial utility. It should be understood that the specific form of the invention hereinabove described is intended to be representative only, as certain modifications within the scope of these teachings will be apparent to those skilled in the art.

Accordingly, reference should be made to the following claims in determining the full scope of the invention.

What is claimed is:

1. A control apparatus for reducing an adhesive force of an adhesive agent adhering between a semiconductor and a substrate, said apparatus comprising: a treating container having a light transmission window and a closure member for closing and opening said container, said container being charged with a workpiece formed by adhering the semiconductor wafer to a substantially light transparent substrate by a photo-setting adhesive agent, a light source positioned opposite said light transmission window, and a deoxygenating means connected to said container for removing at least a substantial portion of the oxygen of an internal atmosphere of the container.

2. A control apparatus as claimed in claim 1, further comprising a casing surrounding said light source having a slit therein, and wherein said treating container is arranged to reciprocate across the front surface of said slit disposed between the container and the light source.

3. A control apparatus as claimed in claim 1, further comprising a first cassette casing which is movable upward and downward and contains therein a plurality of said workpieces, a charging conveyer for taking out the workpiece from the first cassette casing, and a charging arm for charging the workpiece from said charging conveyer into the container having a sucker means thereon, said first cassette casing, said charging conveyer, and said charging arm being provided on one side of the container, a discharging arm for discharging the workpiece from the container having a sucker means thereof, an empty second cassette casing which is movable upward and downward, and a discharging conveyer for conveying the workpiece into said second cassette casing, said discharging arm, said discharging conveyer and said second cassette casing being provided on the other side of the treating container.

4. A control apparatus as claimed in claim 3, wherein said charging arm and said discharging arm convey said workpiece linerarly and charge said workpiece into and discharge said workpiece from the container by respective linear reciprocating movements.

5. A control apparatus as claimed in claim 3, wherein the charging arm and the discharging arm are swingable arm units, and said apparatus further comprises a turning table means provided at a moved discharging position of the discharging arm for receiving said workpiece from said discharging arm, turning said workpiece through a predetermined angle, and transferring said workpiece to the discharging conveyer located therebelow.

* * * * *